(12) United States Patent
Saitoh et al.

(10) Patent No.: US 6,278,647 B1
(45) Date of Patent: Aug. 21, 2001

(54) SEMICONDUCTOR MEMORY DEVICE HAVING MULTI-BANK AND GLOBAL DATA BUS

(75) Inventors: Satoru Saitoh; Shinichi Yamada; Masato Takita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,385

(22) Filed: Mar. 29, 2000

(30) Foreign Application Priority Data

May 28, 1999 (JP) .................................................. 11-149175

(51) Int. Cl.[7] ...................................................... G11C 8/00
(52) U.S. Cl. ...................................................... 365/230.03
(58) Field of Search ........................ 365/230.03, 230.06, 365/233, 51, 63

(56) References Cited

U.S. PATENT DOCUMENTS

| | | | |
|---|---|---|---|
| 5,822,261 | * 10/1998 | Suh | 365/230.03 |
| 5,838,604 | * 11/1998 | Tsuboi et al. | 365/230.03 |
| 6,151,265 | * 11/2000 | Takita et al. | 365/230.03 |
| 6,166,989 | * 12/2000 | Hamamoto et al. | 365/230.03 |

* cited by examiner

*Primary Examiner*—Trong Phan
(74) *Attorney, Agent, or Firm*—Arent Fox Kintner Plotkin & Kahn, PLLC

(57) ABSTRACT

Connections of global data buses GDB0 and GDB1 to local data buses LDB00 to LDB04 in a bank 1 are reverse to those in a bank 0. That is, the global data bus GDB0 is connected to every other local data bus LDB00, LDB02 and LDB04 including both sides in the bank 0, and to every other local data buses LDB11 and LDB13 excluding both sides in the bank 1, while the global data bus GDB1 is connected to every other local data buses LDB01 and LDB03 excluding both sides in the bank 0, and to every other local data bus LDB10, LDB12 and LDB14 including both sides. Further, bit line patterns obliquely traversing sense amplifier rows are reverse to each other with respect to the banks 0 and 1

8 Claims, 7 Drawing Sheets

SEMICONDUCTOR MEMORY DEVICE HAVING MULTI-BANK AND GLOBAL DATA BUS

BACKGROUND OF THE INVENTION

1. Field of the Invention

The present invention relates to a semiconductor memory device having a multi-bank, each bank having a plurality of local data buses connected to global data bus.

2. Description of the Related Art

FIG. 7 is a schematic block diagram showing a configuration of a prior art synchronous DRAM with banks 0 and 1 of the same architecture.

For example, when contents of memory cells C1 and C2 in a memory cell array 10 of the bank 0 are read out, a word line WL is activated by a row decoder 11, whereby a plurality of memory cells coupled to the word line WL are conducted to bit line pairs of respective columns and very small changes in voltage between the bit line pairs are amplified by sense amplifier rows 31 and 32 arranged at both sides of a memory cell block 21 including the word line WL.

On the other hand, block switches BS01 and BS02 corresponding to selected memory cell block 21 are switched on by a block decoder 13, thereby local data buses LDB01 and LDB02 routed in (above and along) the sense amplifier rows 31 and 32 are conducted to global data buses GDB1 and GDB0, respectively.

Then, a column selection line CSL is activated by a column decoder 12, thereby column switches CS20 to CS24 are switched on and voltages on bit lines connected to the column switches CS20 to CS24 are taken out onto local data buses LDB00 to LDB04. Since block switches BS00, BS03, BS04 and BS01 to BS14 are off except the block switches BS01 and BS02, voltages on the buses DB01 and LB02 are transmitted to the global data buses GDB1 and GDB0, then the voltages are amplified in a read/write amplifier 40, next the amplified voltages are converted to external voltages in an I/O data buffer 41 and taken out to the outside as DATA.

In a write operation, DATA provided from the exterior is converted into an internal voltage in the I/O data buffer 41, amplified in the read/write amplifier 40, and transmitted in a reverse direction to that in the read operation to write DATA into the selected memory cell.

Since a memory block is selected with an address in binary number, the number of the memory blocks is an even number "N", and the number of sense amplifier rows sandwiching memory blocks is an odd number (N +1). Further, since voltages are transmitted to different global data buses from local data buses routed in (above and along) sense amplifier rows sandwiching the selected block, the local data buses LDBOO to LDBO4 are alternately coupled to the global data buses GDB0 and GDB1.

Under such conditions, in the prior art, the same pattern has been repeated in laying out on a chip using the same pattern data for each bank to form a plurality of banks.

For this reason, the numbers of local data buses connected to the buses GBD0 and GBD1 are different from each other, and in a case of FIG. 7, the bus GBD0 has a heavier load than that of the bus GBD1. The operating speeds of read and write are determined by one of the buses whichever has a heavier load, which is a cause for slowing down the operating speed.

SUMMARY OF THE INVENTION

Accordingly, it is an object of the present invention to provide a semiconductor memory device that can attain a higher operating speed by eliminating the difference in load between data buses.

In the present invention, there is provided a semiconductor memory device comprising: an even number of banks; each bank including: an odd number, equal to or more than three, of sense amplifier rows; a plurality of local data buses disposed along respective sense amplifier rows; and a plurality of memory cell blocks arranged between adjacent two of the sense amplifier rows, each memory cell block having memory cells arranged in rows and columns, and first and second global data buses, commonly used for the banks, coupled to the local data buses in such a way that two memory cells in a selected memory cell block are simultaneously accessed through two adjacent local data buses sandwiching the selected memory cell block and through the first and second global data buses, wherein the number of local data buses coupled to the first global data bus is equal to the number of local data buses coupled to the second global data bus.

With the present invention, since the number of local data buses coupled to the first global data bus and the number of local data buses coupled to the second global data bus are equal, no imbalance in load between the global data buses arises, thereby improving an operating speed as compared with a prior art case with an imbalance in load.

Other aspects, objects, and the advantages of the present invention will become apparent from the following detailed description taken in connection with the accompanying drawings.

DESCRIPTION OF THE PREFERRED EMBODIMENT

Figure 1:
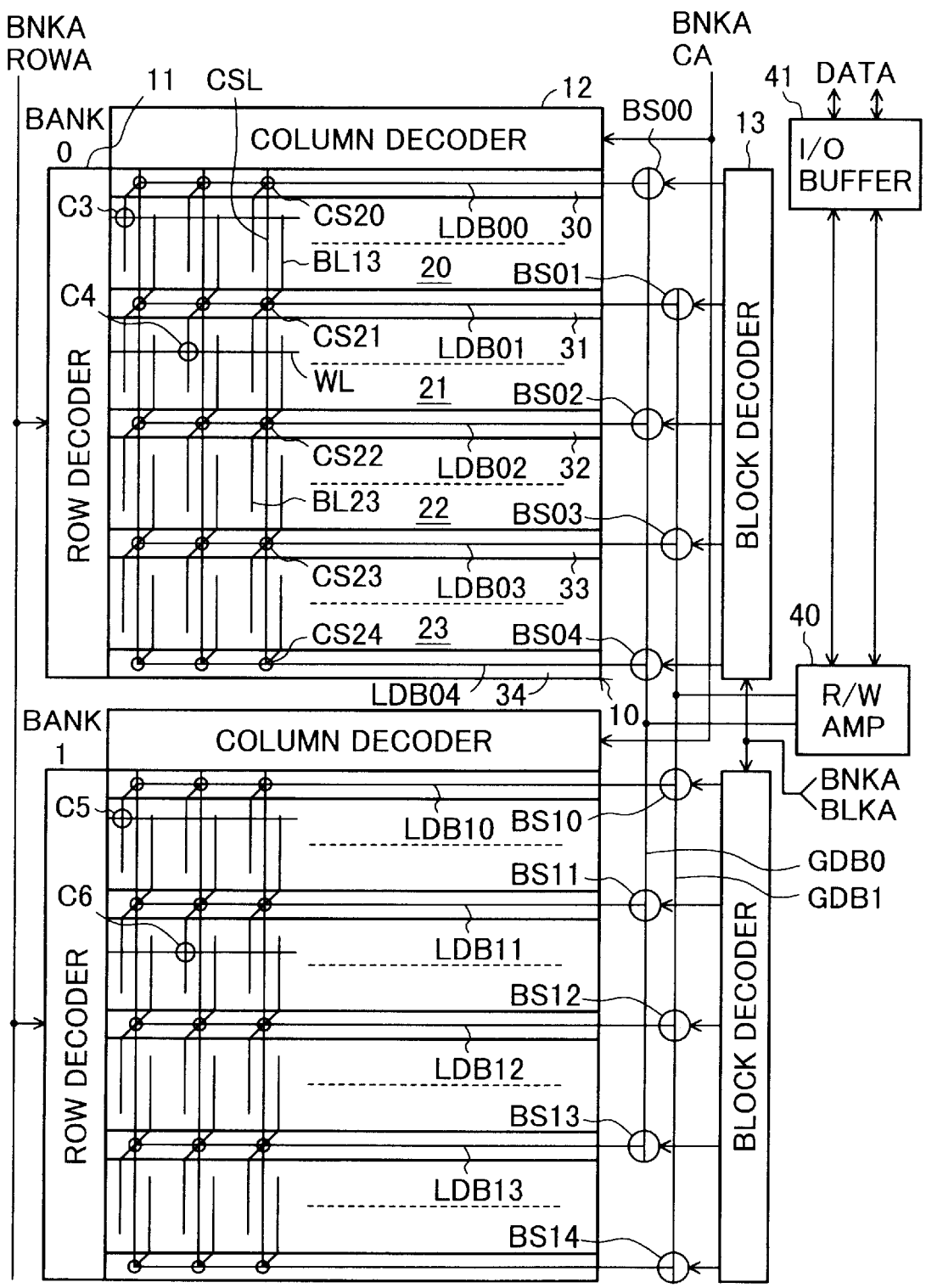
FIG. 1 is a schematic block diagram showing a configuration of a synchronous DRAM of the first embodiment according to the present invention.

Referring now to the drawings, wherein like reference characters designate like or corresponding parts throughout several views, preferred embodiments of the present invention are described below.

FIRST EMBODIMENT

Figure 7:
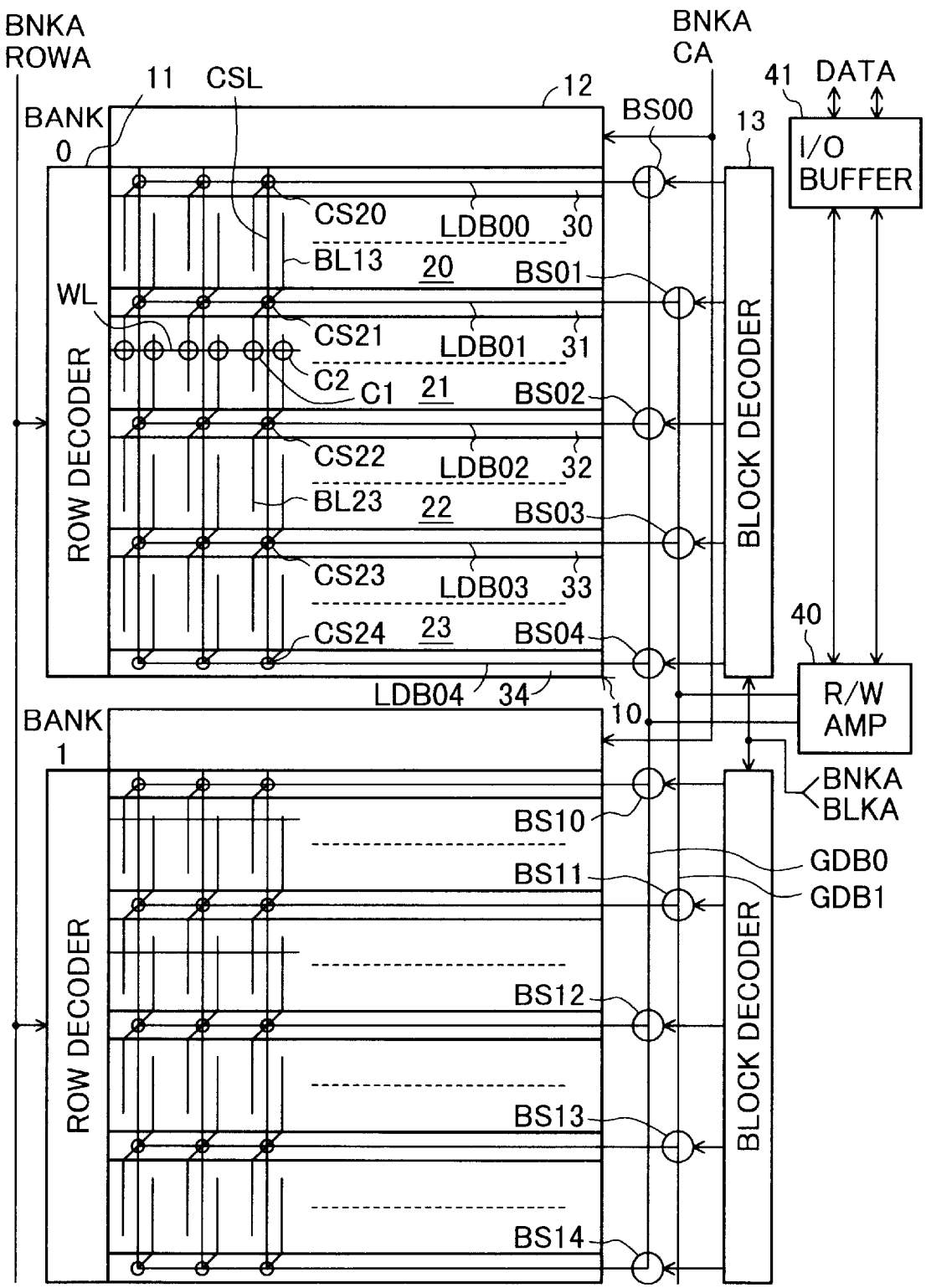
FIG. 7 is a schematic block diagram showing a configuration of a prior art synchronous DRAM.

FIG. 1 is a schematic block diagram, similar to FIG. 7, showing a configuration of a synchronous DRAM of the first embodiment according to the present invention.

Figure 2:
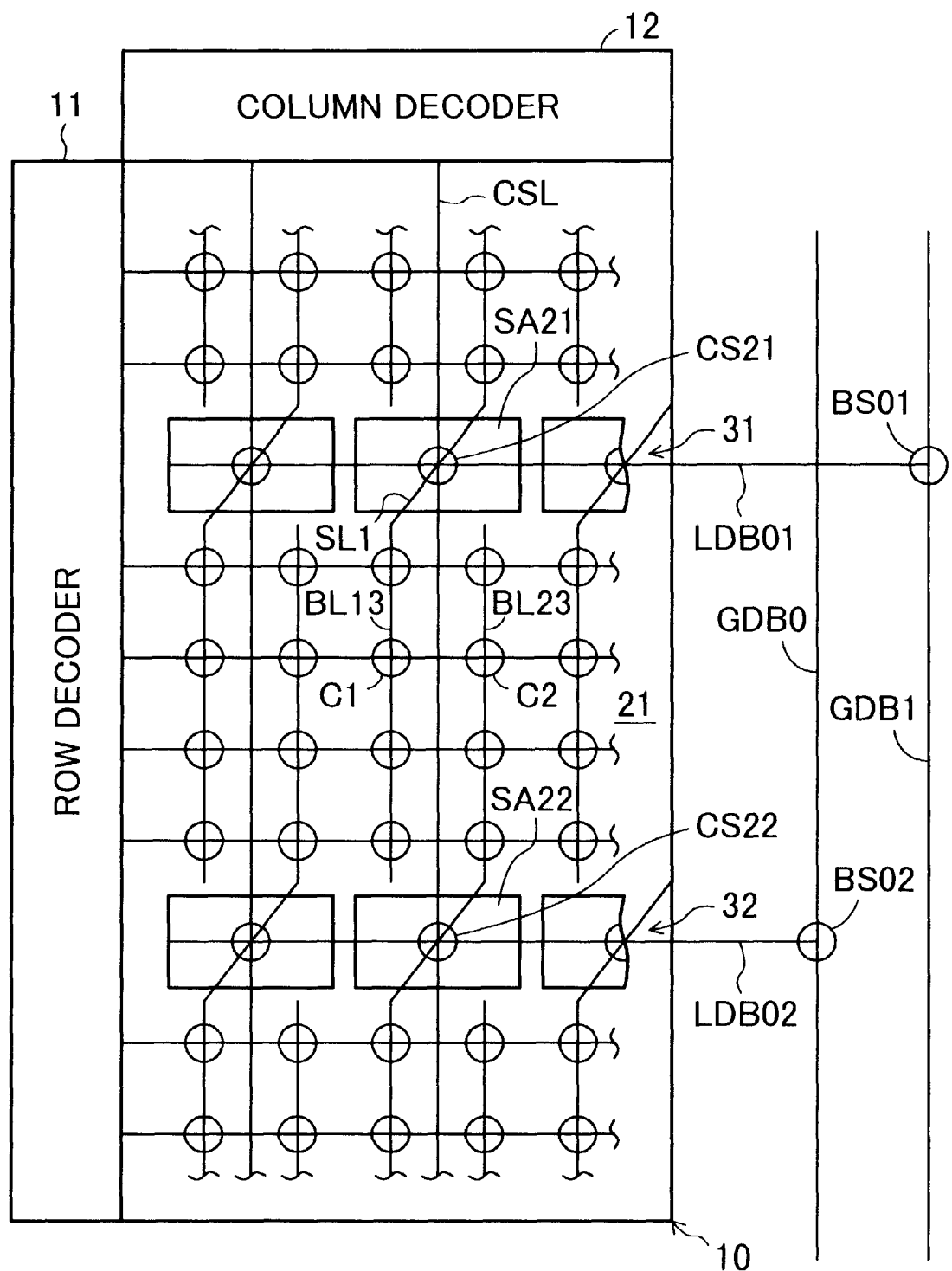
FIG. 2 is a schematic block diagram showing a configuration of part of FIG. 1.

DRAM includes a core portion of banks 0 and 1 with the same configuration as that of FIG. 7, and layouts of the banks are the same as each other. FIG. 2 is a schematic block diagram showing a configuration of part of FIG. 1.

In the bank 0, a row decoder 11 is arranged along a side of a memory cell array 10, and a column decoder 12 is arranged along an adjacent side. The memory cell array 10 includes memory cell blocks 20 to 23 in each of which memory cells are arranged in rows and columns, and sense amplifier rows 30 to 34 arranged so as to sandwich each of the blocks 20 to 23.

In FIGS. 1 and 2, WL indicates a word line, BL13 and BL23 bit lines, C1 to C4 memory cells, CS20 to CS24 column switches, and SA21 and SA22 sense amplifiers. "Bit line" is a complementary signal line pair commonly used for read and write.

In each memory block, each row includes a word line coupled to a plurality of memory cells, and each column includes a bit line pair coupled to a plurality of memory cells. Each sense amplifier row includes a local data bus, column switches each connected between every other bit line and the local data bus, and sense amplifiers each amplifying a voltage between bit lines of a pair connected to a column switch.

Bit line pairs adjacent to each other, for example, bit line pairs BL13 and BL23, are connected to local data buses LDB01 and LDB02 through column switches CS21 and CS22, respectively, in sense amplifier rows adjacent to each other. Each sense amplifier between adjacent memory cell blocks is commonly used in the adjacent memory cell blocks in order to ensure a sufficient space for placement of the sense amplifier. For example, the bit line BL13 of memory blocks adjacent to each other is connected to the same sense amplifier to commonly use in the adjacent memory blocks. In order to enable the on/off control of column switches connected to adjacent bit line pairs by the same column selection line, for example, the bit line BL13 that are routed in adjacent columns of adjacent memory cell blocks are connected with a slant line SL1 traversing a sense amplifier row obliquely.

The global data buses GDB0 and GDB1 that are part of the peripheral circuit are routed so as to be commonly used for the banks 0 and 1. The global data bus GDB0 are connected to every other local data bus in the bank 0 including the buses on both sides of the bank 0, i.e., to local data buses LDB00, LDB02 and LDB04 through block switches BS00, BS02 and BS04. The global data bus GDB1 are connected to every other local data bus excluding the buses on both sides of the bank 0, i.e., to local data buses LDB01 and LDB03 through block switches BS01 and BS03.

Each of the local data buses and global data buses may be a pair of complementary signal lines that are commonly used for read and write or two pairs of complementary signal lines that are individually used for read and write.

The above described configuration is the same as that of FIG. 7.

In FIG. 1, coupling of the global data buses GDB0 and GDB1 to the local data buses in the bank 1 is reverse to that in the bank 0, which is different from FIG. 7. That is, the global data bus GDB1 is connected to every other local data bus in the bank 1 including the buses on both sides of the bank 1, i.e., to local data buses LDB10, LDB12 and LDB14 through block switches BS10, BS12 and BS14. The global data bus GDB0 are connected to every other local data bus in the bank 1 excluding the buses on both sides of the bank 1, i.e., to local data buses LDB11 and LDB13 through block switches BS11 and BS13.

When a bank address BNKA is '0,' only the bank 0 is activated while when the bank address BNKA is '1,' only the bank 1 is activated.

Next, description will be given of operation when the bank address BNKA is '0 '.

The row decoder 11 selects a word line WL depending on a row address ROWA to force memory cells coupled to the selected word line WL to conduct to bit lines. On the other hand, the block decoder 13 selects a memory cell block depending on a block address BLKA to switch on only block switches, among block switches BS00 to BS04, connected to local data buses on both sides of the selected memory cell block. The column decoder 12 selects a column selection line CSL depending on a column address CA to switch on the column switches coupled to the selected line CSL, thereby the bit lines and the local data buses are conducted. Descriptions of the other operation are omitted since those are the same as described in the related art column.

Operation when the bank address BNKA is '1' is similar to the above description.

According to the first embodiment, since the number of local data buses connected to the global data bus GDB0 and that to the global data bus GDB1 are equal to each other, no imbalance in load between the data buses arises, and an operating speed is improved as compared with a prior art case where a load imbalance arose.

SECOND EMBODIMENT

In FIG. 1, for example, the memory cell C3 in the bank 0 is accessed through the global data bus GDB0, while a memory cell C5 in the bank 1 corresponding to the memory cell C3 in the bank 0 is accessed through the global data bus GDB1. Since data written in a cell of some address is read out from the same address, such a difference between the banks 0 and 1 are no problem in normal use. But, in failure analysis, it is necessary to consider such a different corresponding relation in regard to memory cells between the banks 0 and 1.

Figure 3:
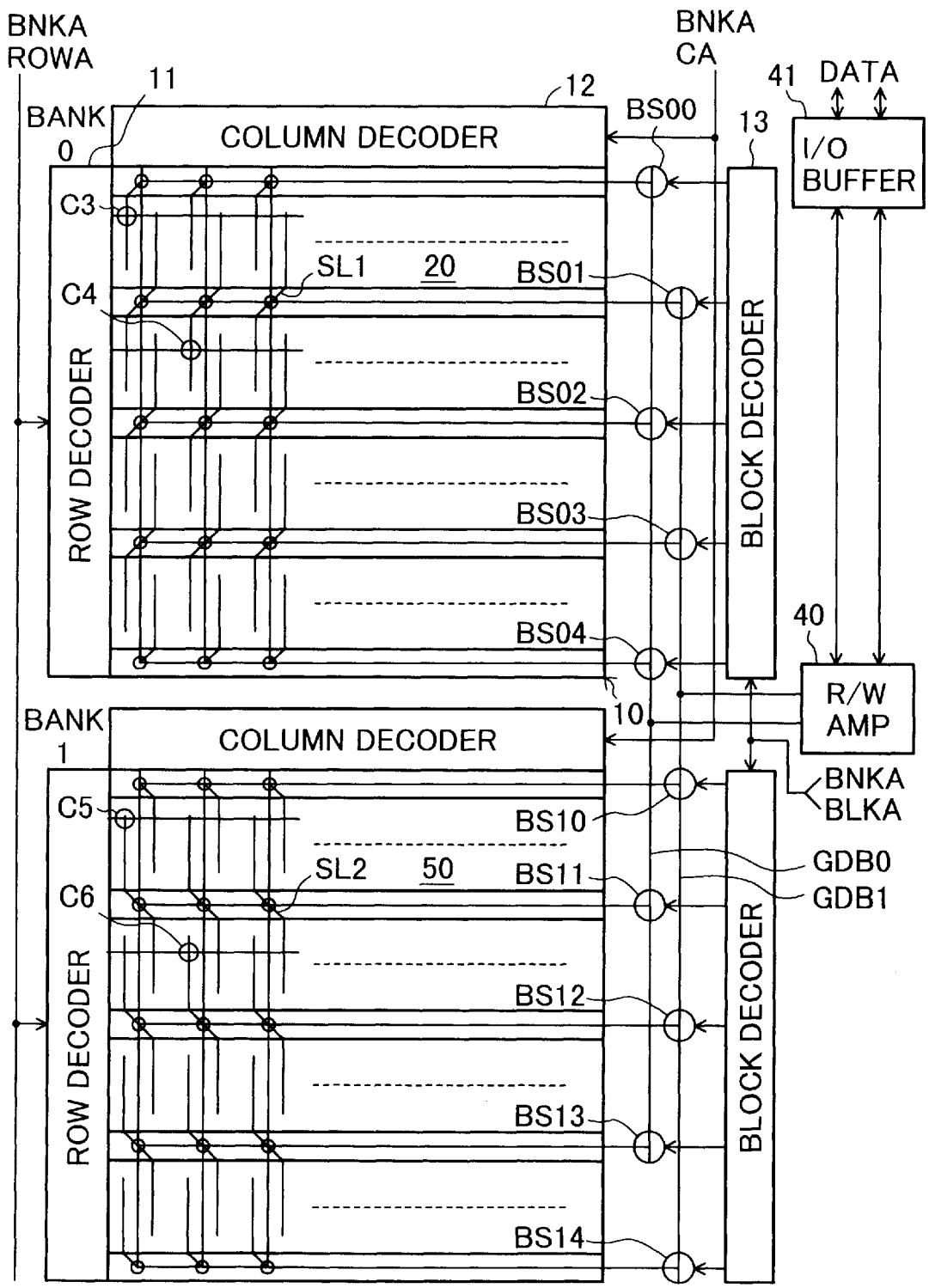
FIG. 3 is a schematic block diagram showing a configuration of a synchronous DRAM of the second embodiment according to the present invention.

In the second embodiment, a synchronous DRAM is configured as shown in FIG. 3 in order that the corresponding relation is not required to be considered.

That is, slant angles to column directions of sections (for example, SL1 and SL2) of bit line patterns traversing sense amplifier rows are reverse to each other with respect to the banks 0 and 1. In other words, if the bit line pattern of the bank 0 is flipped horizontally or vertically, it matches with that of the bank 1. The other part is the same configuration as that of FIG. 1.

For example, when the memory cell C3 of the bank 0 is accessed, the block switches BS00 and BS01 corresponding to the memory cell block 20 including the memory cell 3 are switched on, and the C3 is accessed through the block switches BS00 and the global data bus GDB0.

When the memory cell C5 of the bank 1 corresponding to the memory cell C3 is accessed, the block switches BS10 and BS11 corresponding to a memory cell block 50 including the memory cell C5 are switched on, and the C5 is accessed through the block switch BS11 and the global data bus GDB0.

Likewise, a memory cell C4 of the bank 0 is accessed through the global data bus GDB1, while a memory cell C6 of the bank 1 corresponding to the memory cell C4 is accessed through the global data bus GDB1.

According to the second embodiment, since corresponding memory cells of the banks 0 and 1 are accessed through the same global data bus, in failure analysis, it is not necessary to consider a corresponding relation between the banks 0 and 1 in connection with a global data bus, depending on kinds of DRAM.

THIRD EMBODIMENT

Figure 4:
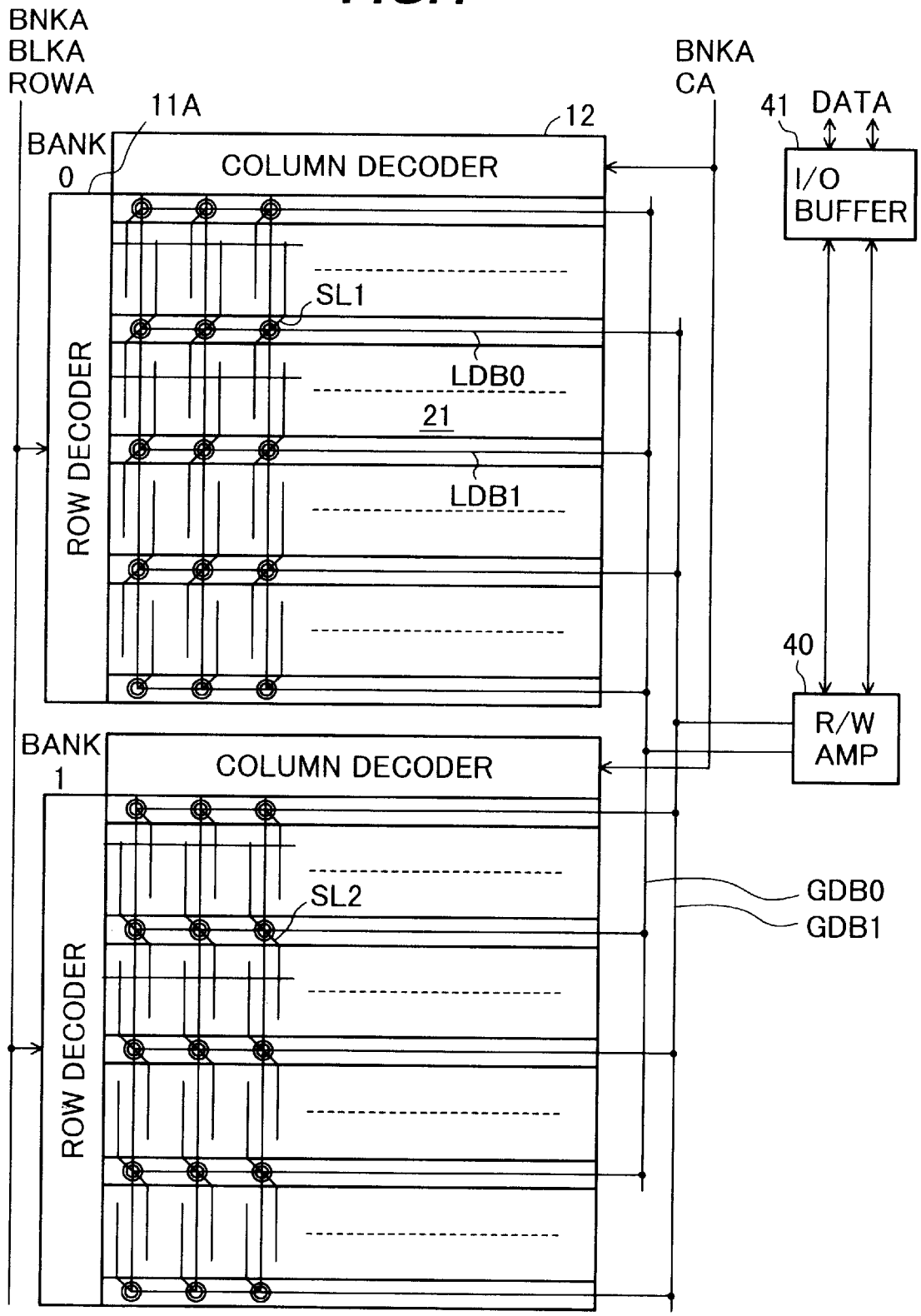
FIG. 4 is a schematic block diagram showing a configuration of a synchronous DRAM of the third embodiment according to the present invention.

FIG. 4 is a schematic block diagram showing a configuration of a synchronous DRAM of the third embodiment according to the present invention.

In the DRAM, the block switches BS00 to BS04 and BS10 to BS14 shown in FIG.3 are omitted. The global data buses are formed in the wiring layer vertically adjacent to the wiring layer of the local data buses above a substrate, and directly connected through interlayer contacts to the local data buses. The block decoder 13 of FIG. 3 is also omitted and its function is included in a row decoder 11A.

Figure 5:
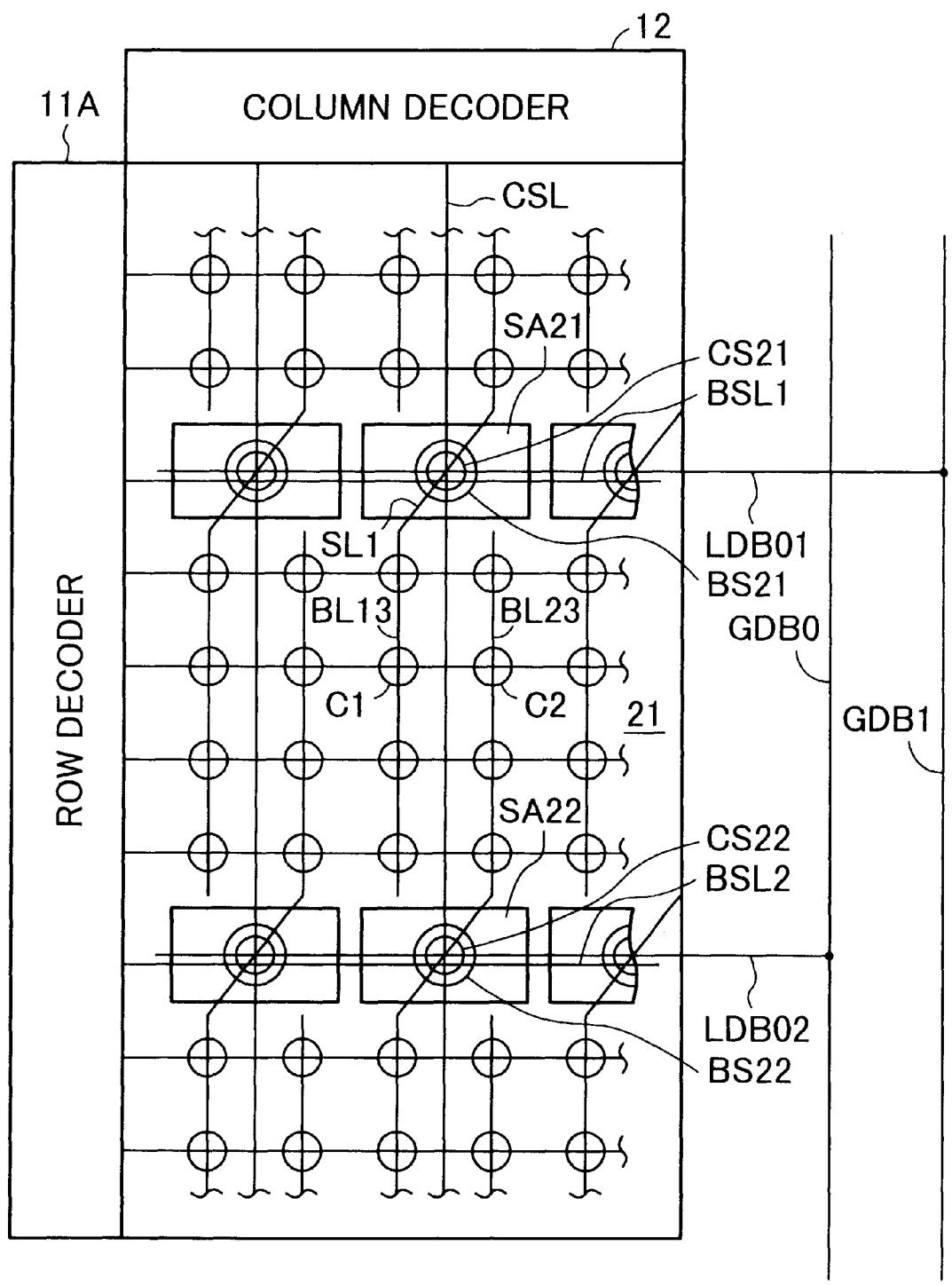
FIG. 5 is a schematic block diagram showing a configuration of part of FIG. 4.

FIG. 5 is a schematic block diagram showing the configuration of part of FIG. 4.

Between a local data bus and each bit line, a column switch and a block switch are connected in series. For example, the column switch CS21 and the block switch BS12 are connected in series between the local data bus LDB01 and the bit line BL13, and the column switch CS22 and the block switch BS22 are connected in series between the local data bus LDB02 and the bit line BL23. These block switches are on/off controlled by the block selection lines BSL1 and BSL2 connected to a block decoder (not shown) within the row decoder 11A. For example, when the memory cell block 21 is selected, the block selection lines BSL1 and BSL2 are activated and the block switches coupled to the block selection lines BSL1 and BSL2 are switched on. Next, for example, when the column selection line CSL is activated, the column switches coupled to the column selection line CSL are switched on and as a result, the bit line BL13 is conducted to the local data bus LDB01 through the switches BS21 and CS21, while the bit line BL23 is conducted to the local data bus LDB02 through the switches BS22 and CS22. Therefore, access operation is similar to the case of FIG. 3.

Figure 6:
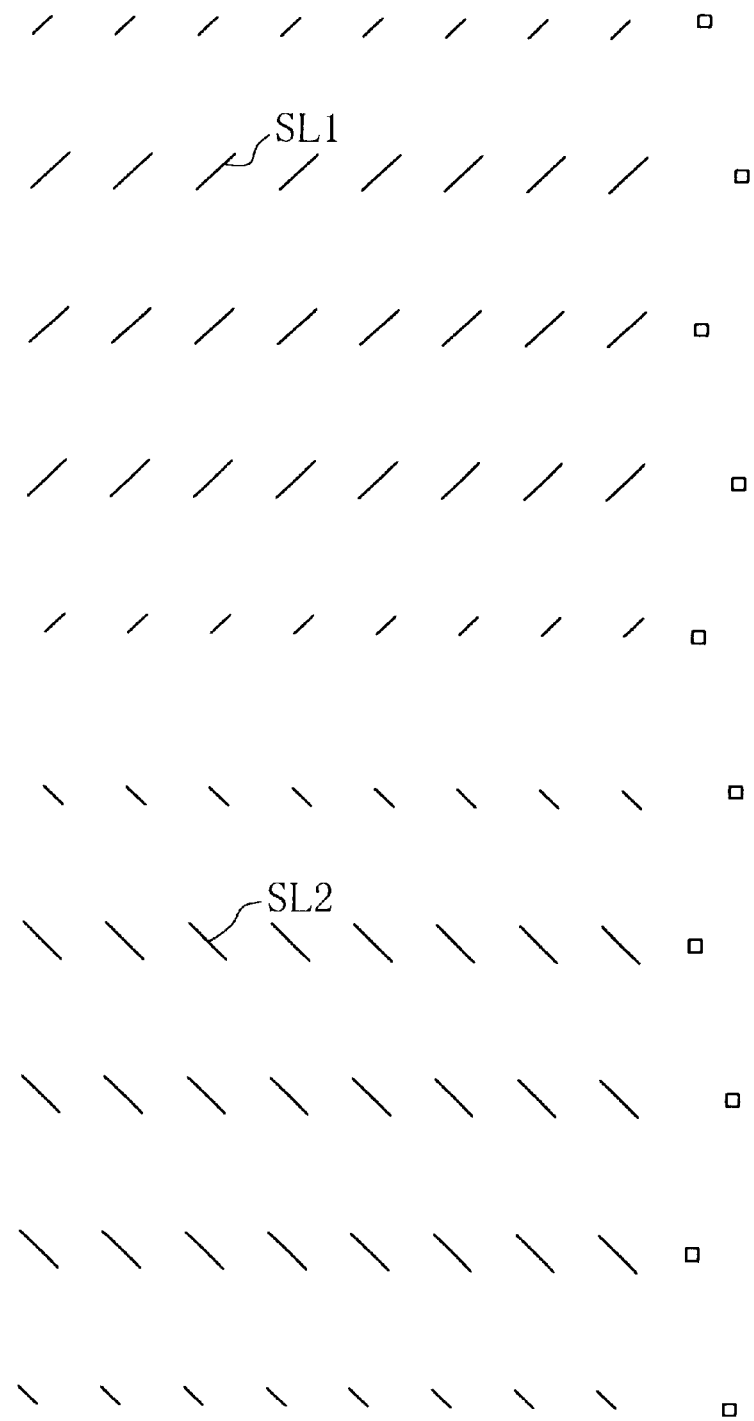
FIG. 6 is a schematic layout plan showing differences in pattern between banks 0 and 1 of FIG. 4.

The differences in pattern between the banks 0 and 1 are, as shown in FIG. 6, slant portions of bit pattern traversing sense amplifier rows and a interlayer contact hole pattern for connecting between the local data buses and the global data buses. In FIG. 6, for simplicity in relation to FIG. 4, there is shown a contact hole pattern in case where each data bus includes a single line.

In the case of FIG. 3, the layout pattern of the block switches (transistors) in the bank 0 is different form that in the bank 1, whereas in the case of FIG. 4, since there is no such a difference, the pattern difference between the banks 0 and 1 becomes simpler as shown in FIG. 6.

In LSI design, it is required to design layouts common to all the banks and layouts different among banks. According to the third embodiment, the latter different layouts are simpler, entailing an advantage of making design of LSI easier even with more of banks.

What is claimed is:

1. A semiconductor memory device comprising:
   an even number of banks; each bank including:
      an odd number, equal to or more than three, of sense amplifier rows:
      an odd number of local data buses each disposed above and along corresponding sense amplifier row; and
      a plurality of memory cell blocks interposed between adjacent two of said sense amplifier rows, each memory cell block having memory cells arranged in rows and columns, and
      first and second global data buses, commonly used for said banks, coupled to said local data buses for said banks in such a way that two memory cells in a selected memory cell block are simultaneously accessed through adjacent two of said local data buses sandwiching said selected memory cell block and through said first and second global data buses,
   wherein the number of local data buses for said banks coupled to said first global data bus is equal to the number of local data buses for said banks coupled to said second global data bus.

2. The semiconductor memory device according to claim 1, wherein local data buses arranged on both sides of one of adjacent banks are coupled to said first global data bus while local data buses arranged on both sides of the other of said adjacent banks are coupled to said second global data bus.

3. The semiconductor memory device according to claim 2, wherein said bank further comprises bit lines in respective columns, each bit line being coupled to a plurality of said memory cells, adjacent bit lines being coupled to respective local data bus lines in adjacent sense amplifier rows,
   wherein each sense amplifier row further has a plurality of column switches connected between said local data bus and every other bit line; and a plurality of sense amplifiers, each amplifying a voltage on said bit line,
   where said bank further comprises a plurality of column selection lines connected to said column switches so that said adjacent bit lines are switched by the same column selection line.

4. The semiconductor memory device according to claim 3,
   wherein said bit line has first, second and third portions, said first and second portions are disposed in adjacent columns and adjacent memory cell blocks, respectively, and said third portion are connected between said first and second portions with obliquely traversing a sense amplifier row between said adjacent memory cell blocks,
   wherein flipped one of bit line patterns of adjacent banks coincides with the other thereof.

5. The semiconductor memory device according to claim 4, wherein said local data buses are directly connected through interlayer contacts to said global data buses, and flipped one of interlayer contact patterns of adjacent banks coincides with the other thereof.

6. A semiconductor memory device comprising:
   a first and a second banks; each bank including:
      a plurality of memory cell blocks, each including memory cells;
      an odd number of sense amplifier rows interposed between adjacent two of said memory cell blocks and outside portions of the memory cell blocks such that one memory cell block is located between adjacent two of said sense amplifier rows; and
      an odd number of local data buses, each disposed above and along corresponding sense amplifier row, and
      a pair of global data buses, comprising a first and a second global data buses for said first and second banks coupled to said local data buses,
   wherein said first global data bus is coupled to said local data buses above m-th (where m is a odd number.) sense amplifier rows in said first bank and is coupled to said local data buses above n-th (where n is an even number.) sense amplifier rows in said second bank, and
   said second global data bus is coupled to said local data buses above n-th sense amplifier rows in said first bank and is coupled to said local data buses above m-th sense amplifier rows in said second bank.

7. The semiconductor memory device according to claim 6, wherein the number of local data buses coupled to said first global data bus is the same as that of local data buses coupled to said second global data bus.

8. The semiconductor memory device according to claim 6, wherein a pair of data from one of said memory cell blocks are transmitted through a pair of local data buses above said sense amplifier rows on both sides of said one of memory cell blocks, and are supplied to said pair of global data buses.

* * * * *